United States Patent [19]
Taura et al.

[11] Patent Number: 5,963,500
[45] Date of Patent: Oct. 5, 1999

[54] SEMICONDUCTOR MEMORY DEVICE

[75] Inventors: Tadayuki Taura, Zushi; Shigeru Atsumi, Yokohama; Hironori Banba, Kamakura, all of Japan

[73] Assignee: Kabushiki Kaisha Toshiba, Tokyo, Japan

[21] Appl. No.: 09/030,670

[22] Filed: Feb. 25, 1998

[30] Foreign Application Priority Data

Feb. 26, 1997 [JP] Japan .................................. 9-042417

[51] Int. Cl.$^6$ .................................................. G11C 8/00
[52] U.S. Cl. .............................. 365/230.06; 365/189.02; 365/201
[58] Field of Search .............................. 365/201, 230.02, 365/230.03, 230.06, 189.02

[56] References Cited

U.S. PATENT DOCUMENTS 5,124,949  6/1992  Morigami .................................. 365/210

*Primary Examiner*—Son Mai
*Attorney, Agent, or Firm*—Loeb & Loeb LLP

[57] ABSTRACT

A decoder circuit selectively controls the transfer gate group. The transfer gate group is stacked so as to form a tree structure having multiple stages of transfer gates and enable a monitoring bus line to be connected to any column in a memory cell array. This configuration enables the current in each memory cell to be monitored at an external pad via a single bus line, which reduces the area occupied by the bus lines, suppressing an increase in the chip size.

19 Claims, 7 Drawing Sheets

| DIN3 | DIN2 | DIN1 | DIN0 | I/Oi |
|---|---|---|---|---|
| L | L | L | L | I00 |
| L | L | L | H | I01 |
| L | L | H | L | I02 |
| L | L | H | H | I02 |
| L | H | L | L | I04 |
| L | H | L | H | I05 |
| L | H | H | L | I06 |
| L | H | H | H | I07 |
| H | L | L | L | I08 |
| H | L | L | L | I09 |
| H | L | H | L | I010 |
| H | L | H | H | I011 |
| H | H | L | L | I012 |
| H | H | L | H | I013 |
| H | H | H | L | I014 |
| H | H | H | H | I015 |

FIG. 7

SEMICONDUCTOR MEMORY DEVICE

BACKGROUND OF THE INVENTION

The present invention relates to a semiconductor memory device that uses MOS transistors as memory elements and is capable of writing and reading data.

A nonvolatile transistor used as a memory cell in an EEPROM, which erases data electrically, is generally composed of two layers of polycrystalline silicon separated by an insulating film as shown in FIG. 1. A floating gate 701 is made of a first polycrystalline silicon layer and a control gate 702 is made of a second polycrystalline silicon layer. Numeral 703 indicates a source, 704 a drain, 705 a silicon substrate, 706 a contact hole, and 707 a data line made of aluminum (Al). The data line passes through the contact hole 706 and is connected to the drain 704. The data write, read, and erase operations in a memory cell having the above structure will be described below.

Writing is done by setting the drain potential $V_D$ at 5.5 V, the control gate potential $V_{CG}$ at 10 V, and the source potential $V_S$ at 0 V and injecting hot electrons into the floating gate.

Erasing is done by setting the control gate potential $V_{CG}$ at −7 V, placing the drain potential $V_D$ in the floating state, and applying, for example, 6.5 V to the source. At this time, the electrons in the floating gate are pulled out by the tunnel effect.

Reading is done by setting the control potential $V_{CG}$ at 5 V, the drain potential $V_D$ at 0.8 V, and the source potential $V_S$ at 0 V. In this case, when "0" has been stored in the memory cell (in the written state), almost no current flows between the source and the drain. When the stored data is "1" (in the erased state), a cell current of about 60 μA flows between the source and the drain.

In a nonvolatile semiconductor memory device using such transistors as memory cells, the distribution of the threshold voltages of the memory cell transistors after writing and erasing is very important.

The distribution of the threshold voltages of memory cells after erasure will be described using FIG. 2. In a memory cell, the threshold voltage generally varies in the range of about 2 to 3 V after erasure. The upper limit of variations in the threshold voltage is assumed to be Vthb. If the upper limit is lowered, the cell current in the memory cell as a whole will increase. This makes it possible to read the data from the memory cell at faster speeds.

When variations in the threshold voltage are great, the lower limit might be Vthc. If the lower limit is Vthc, the threshold voltage is lower than 0 V. Under this condition, when the data is read from a "0" cell on the same data line, leakage current will develop at a cell whose threshold voltage is lower than 0 V, which causes "1" to be read, resulting in a faulty operation. To prevent the faulty operation, it is necessary to set the threshold voltage after erasure at 0 V or higher (Vtha).

To examine variations in the threshold voltage in such a memory cell, a test circuit capable of externally monitoring the current in the memory cell is often provided.

FIG. 3 is a circuit diagram of the main section of a conventional semiconductor memory device equipped with a test circuit capable of externally monitoring the current in memory cells.

In the semiconductor memory device, a plurality of memory cells (not shown) arranged in a matrix within a memory cell array 21 are accessed by supplying signals to a row decoder 18 and column gates 20. The column gates 20 are controlled by a column decoder 19. The data items corresponding to the accessed memory cells are read in parallel via sense amplifier circuits (S/A0 to S/Ai) 22 and buffer circuits (Dout0 to Douti) 23. The read data items are outputted at pads IO0 to IOi. Namely, the memory cell array is divided into blocks. The data items corresponding to the accessed memory cells in each block are directed to specific pads.

Between the pads IO0 to IOi and data lines DL0 to DLi, transfer gates MT0 to MTi for use in an external monitoring are provided. When the monitor test signal "MONITOR" goes high, the cell current in the memory cell transistors of the memory cell array selected by the column decoder and row decoder via column gate transistors CT00 to CTij can be monitored externally at the pads IO0 to IOi.

In the structure of the test circuit, the transfer gates MT0 to MTi for monitoring are often provided near the memory cell array in order to suppress the generation of parasitic capacity on data lines DL0 to DLi. To carry the outputs of the gates to the pads, the gates need bus lines BUSCELL0 to BUSCELLi, respectively. Generally, the number of bits read in parallel is 8, 16, 32 or the like. Therefore, the number of bus lines results directly in an increase in the chip size of the memory device. That is, as the number of bits increases, the number of bus lines cannot be ignored accordingly.

To suppress an increase in the number of the bus lines, the output buses SAO0 to SAOi in the read circuit are sometimes forced to also act as BUSCELL0 to BUSCELLi. With such a structure, BUSCELL0 to BUSCELLi can be eliminated but an unwanted parasitic capacity is added to the output buses SAO0 to SAOi, leading to the degradation of the performance of the memory device.

The above-mentioned problems are summarized as follows.

In a conventional semiconductor memory device, a plurality of monitoring bus lines are required to equip the device with a test circuit for monitoring the current in each memory cell, which leads to an increase in the chip size. When another internal bus is caused to also serve as the monitoring bus, an unwanted parasitic capacity caused by the transfer gates for monitoring is added to the original internal bus, resulting in the degradation of the performance of the memory device.

BRIEF SUMMARY OF THE INVENTION

Accordingly, it is an object of the present invention to provide a semiconductor memory device capable of suppressing an increase in the chip size and preventing the degradation of the performance by using only a single monitoring bus in a test circuit.

According to one aspect of the present invention, there is provided a semiconductor memory device comprising: a memory cell array in which a plurality of memory cells each to be accessed in accordance with selected row and column are arranged in a matrix; an external terminal used to monitor the current in each of the plurality of memory cells; a single bus line, connected to the external terminal, for conducting the current to the external terminal; a transfer gate group, provided between the bus line and the memory cell array and stacked so as to form a tree structure having multiple stages of transfer gates, for selectively connecting the bus line to any column in the memory cell array; and a decoder circuit for controlling to select the transfer gates for each of the multiple stages in the transfer gate group.

In the semiconductor memory device, the memory cells may include regular memory cells to be accessed for data acquisition and a dummy cell for generating a reference potential to read the data from the regular memory cells, and redundancy memory cells replaceable with the regular memory cells. In this case, the semiconductor memory device may further comprise a switch circuit, provided between the transfer gate group and the bus line, for electrically connecting either the regular memory cells' side or the dummy cell's side to the bus line via the transfer gate group.

An output of the decoder circuit may be obtained from a potential boosted inside the decoder circuit.

During the monitoring of the current in each of the memory cells, a monitoring power-supply voltage may be supplied to a row decoder for selecting the row. It is desirable that the monitoring power-supply voltage should be variable. In this case, a threshold voltage for each of the memory cells is determined from the current monitored at the external terminal. The monitoring power-supply voltage may be supplied from an external terminal different from the external terminal.

The semiconductor memory device may further comprise a plurality of terminals for transmitting signals corresponding to the columns in the memory cell array. In this case, the decoder circuit may control to select the transfer gates in accordance with a combination of the signals supplied from the plurality of terminals.

According to another aspect of the present invention, there is provided a semiconductor memory device comprising: a memory cell array in which a plurality of memory cells each to be accessed in accordance with selected row and column are arranged in a matrix; an external terminal used to monitor the current in each of the plurality of memory cells; a single bus line, connected to the external terminal, for conducting the current to the external terminal; a transfer gate group, provided between the bus line and the memory cell array and stacked so as to form a tree structure having multiple stages of transfer gates, for selectively connecting the bus line to any column in the memory cell array; a decoder circuit for controlling to select the transfer gates for each of the multiple stages in the transfer gate group; and a plurality of terminals for transmitting signals corresponding to the columns in the memory cell array, wherein one of the plurality of terminals also serves as the external terminal.

In the semiconductor memory device, the external terminal may be a terminal other than a terminal for input/output.

According to still another aspect of the present invention, there is provided a semiconductor memory device comprising: a memory cell array that always allows the memory cells to be accessed in parallel; decode means capable of selecting a signal corresponding to any one of the memory cells during the parallel accessing; and a single bus line for transmitting the signal selected by the decode means to the outside of the device.

The decode means may select the signal in accordance with a combination of externally supplied signals.

The decode means may be activated when a test signal is externally supplied and may apply to the memory cell array a signal potential different from that during the ordinary parallel access to the memory cells.

The semiconductor memory device may further comprise an external terminal connected to the bus line and used to monitor a current corresponding to the memory cell selected by the decode means. In this case, a threshold voltage for the memory cell may be determined from the current monitored at the external terminal.

The decode means may include: a transfer gate group, provided between the bus line and the memory cell array and stacked so as to form a tree structure having multiple stages of transfer gates, and a decoder circuit for controlling to select the transfer gates for each of the multiple stages in the transfer gate group. In this case, the decoder circuit may have a level shifter and controls to select the transfer gates using the high-potential signal outputted from the level shifter.

A control gate of a memory cell selected by the decode means may be applied with two or more kinds of voltages via the bus line.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a table listing the destinations to which the signals to be decoded are directed in the monitor and I/O decoder circuit of FIG. 5.

DETAILED DESCRIPTION OF THE INVENTION

Hereinafter, referring to the accompanying drawings, embodiments of the present invention will be explained.

Figure 1:
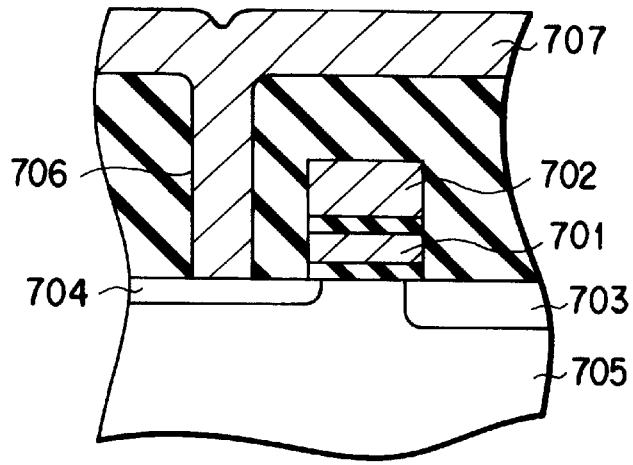
FIG. 1 is a sectional view of an ordinary nonvolatile transistor acting as a memory cell in a semiconductor memory device.
Figure 2:
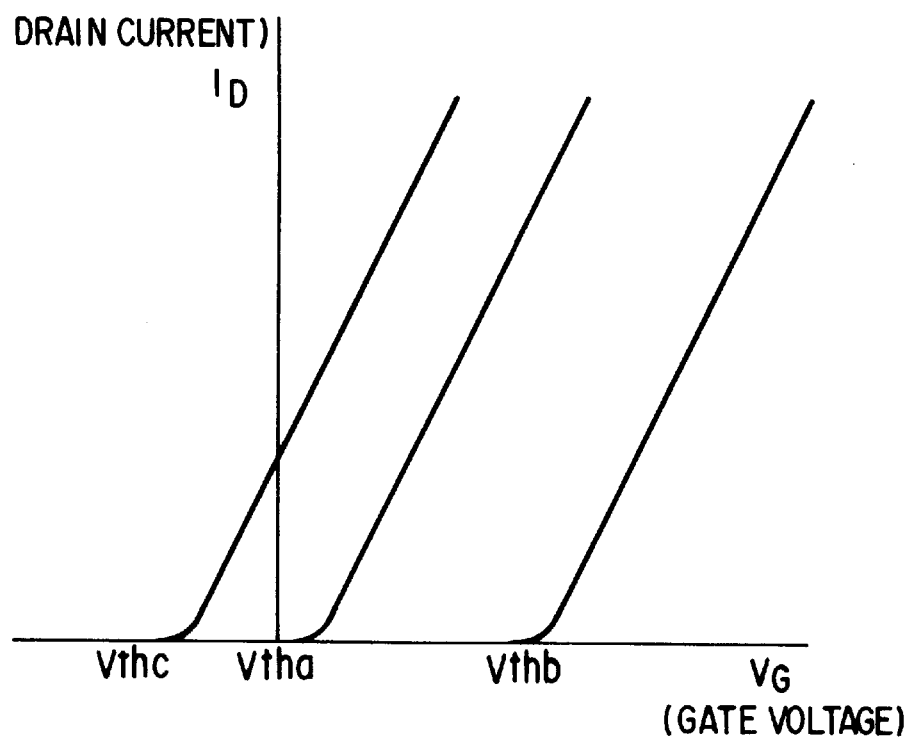
FIG. 2 is a voltage-current characteristic diagram to help explain the distribution of the threshold voltage of a memory cell after erasure.
Figure 3:
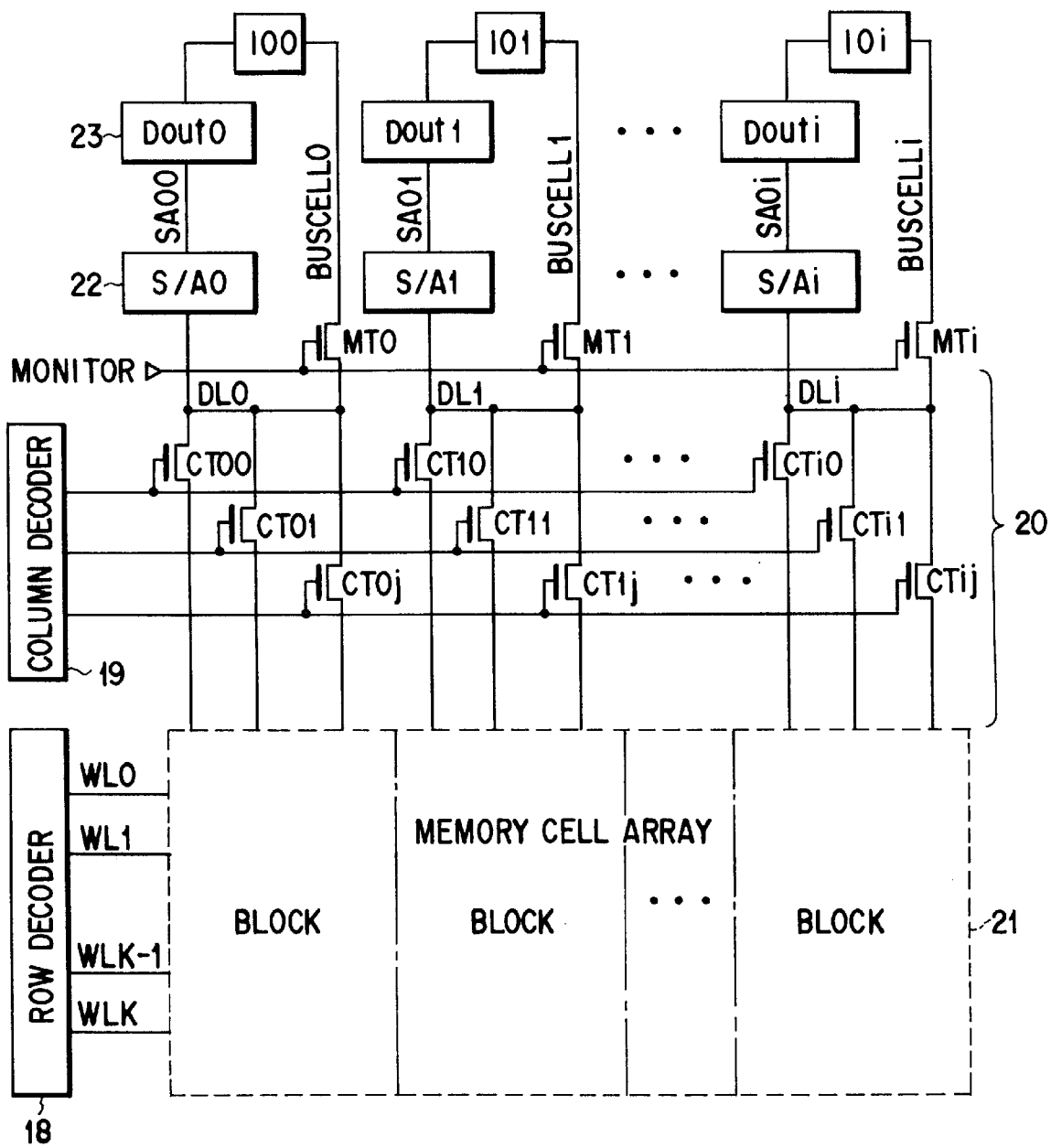
FIG. 3 is a circuit diagram of the main section of a semiconductor memory device equipped with a test circuit capable of externally monitoring the current in a memory cell.
Figure 4:
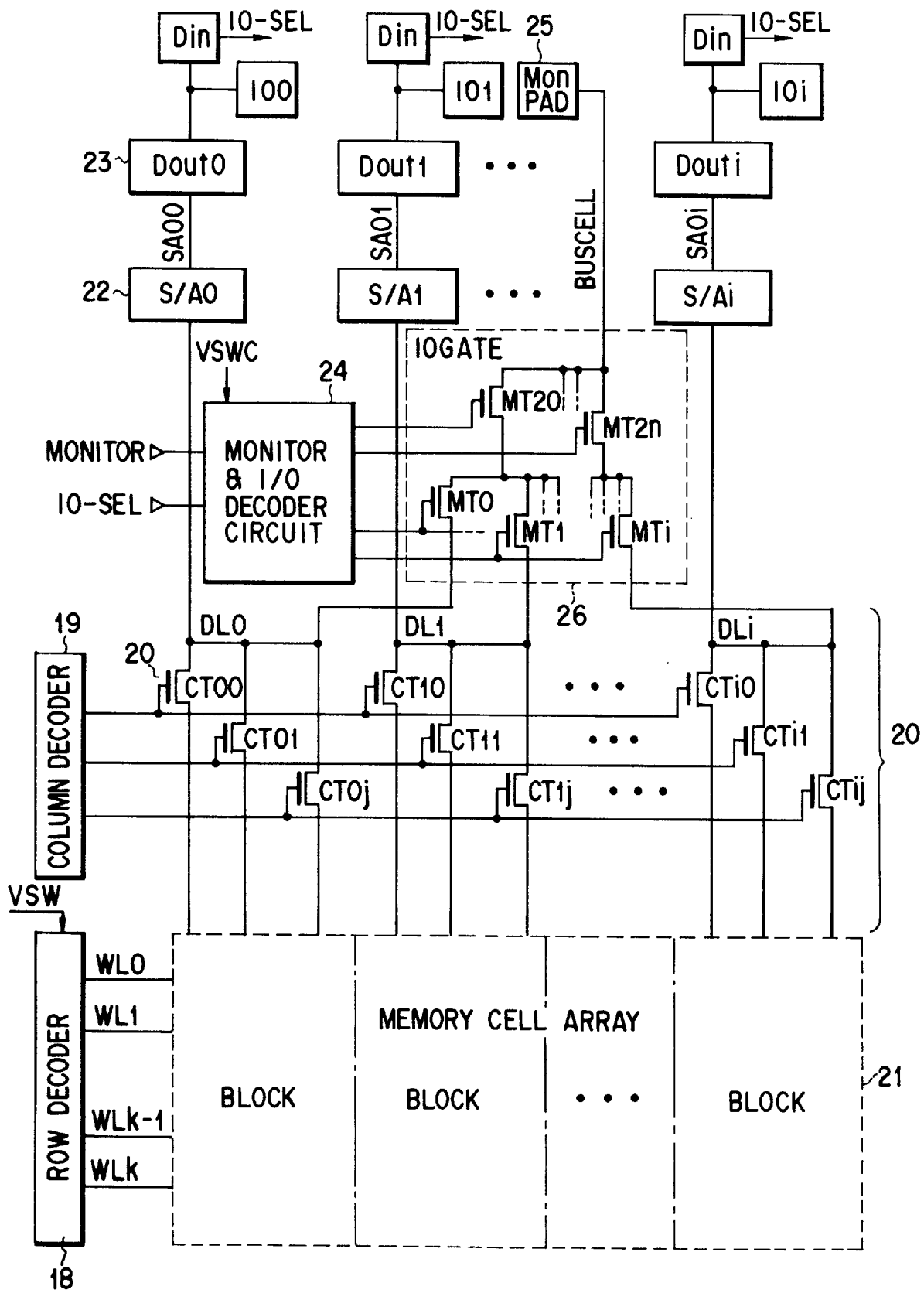
FIG. 4 is a circuit diagram of the main section of a semiconductor memory device according to a first embodiment of the present invention.

FIG. 4 is a circuit diagram of the main section of a semiconductor memory device according to a first embodiment of the present invention.

The semiconductor memory device is equipped with a test circuit capable of externally monitoring the current in a memory cell. A plurality of memory cells (not shown) arranged in a matrix within a memory cell array 21 are accessed by a row decoder 18 and a column decoder 19. The column decoder 19 applies signals to column gates 20. The data items corresponding to the accessed memory cells are read in parallel via sense amplifier circuits (S/A0 to S/Ai) 22 and buffer circuits (Dout0 to Douti) 23. The read data items are outputted at pads IO0 to IOi. Namely, the memory cell array is divided into blocks. The data items corresponding to the memory cells accessed in each block are directed to specific pads.

In such a semiconductor memory device, first-stage transfer gates MT0 to MTi and second transfer gates MT20 to MT2n for directing the cell current to the outside of the device are provided on data lines DL0 to DLi. These gates constitute a transfer gate group (IOGATE) 26 for cell current monitoring. The transfer gate group 26 is stacked so as to form a tree structure.

The transfer gate group (IOGATE) 26 is selectively controlled by the output signals of a monitor and I/O decoder circuit 24. The monitor and I/O decoder circuit 24 selectively controls the transfer gate group (IOGATE) 26 on the basis of a combination of the signal MONITOR and a plurality of I/O select signals IO_SEL. The signal MONITOR is a test signal in monitoring the cell current in a memory cell.

A monitoring bus line BUSCELL passes through stages of transfer gates in the transfer gate group (IOGATE) 26 and is electrically connected to one of the data lines DL0 to DLi. For a monitoring external pad 25, for example, a pad except for the ones corresponding to the address and input/output pins is used. It is preferable to use a pad corresponding to one of the unused control pins(e.g., Ready/Busy pins) during the test.

To monitor the current in any one of the memory cells in the memory cell array, an external power supply voltage VSW is supplied to the row decoder to supply a potential different from that in an ordinary memory read operation to the word line connected to the gate in the memory cell. The power supply voltage VSW is supplied via, for example, a selector switch from an unused pad during the test. The power supply voltage VSW is variable. The threshold voltage of the cell can be determined from the cell current obtained at the external pad 25 during the test.

With the above configuration, the transfer gate group (IOGATE) 26 and the monitor and I/O decoder circuit 24 are arranged relatively close to each other. The area that these circuits occupy is negligible with respect to the chip size. Use of only the single bus makes smaller the area occupied by the test circuit for monitoring the current in a memory cell, which decreases the chip size.

A signal IO_SEL for selecting I/O is inputted to the input monitor and I/O decoder circuit 24 via, for example, a specific pad. The signal IO_SEL is obtained at a specific pad Din during the test, as in an ordinary read/write process. The signal IO_SEL is then sent to the monitor and I/O decoder circuit 24.

Because I/O can be selected depending on a combination of high and low signal inputs to the pads, the remaining pads can be used to switch to the transistor (dummy cell) side for generating a reference potential for reading and monitor the current in the dummy cell.

The structure related to the input of the signal IO_SEL used to selecting the I/O (the structure of the monitor and I/O decoder circuit) and the structure that enables the current in the dummy cell to be monitored (the structure of the transfer gate group) will be described using concrete examples.

Figure 5:
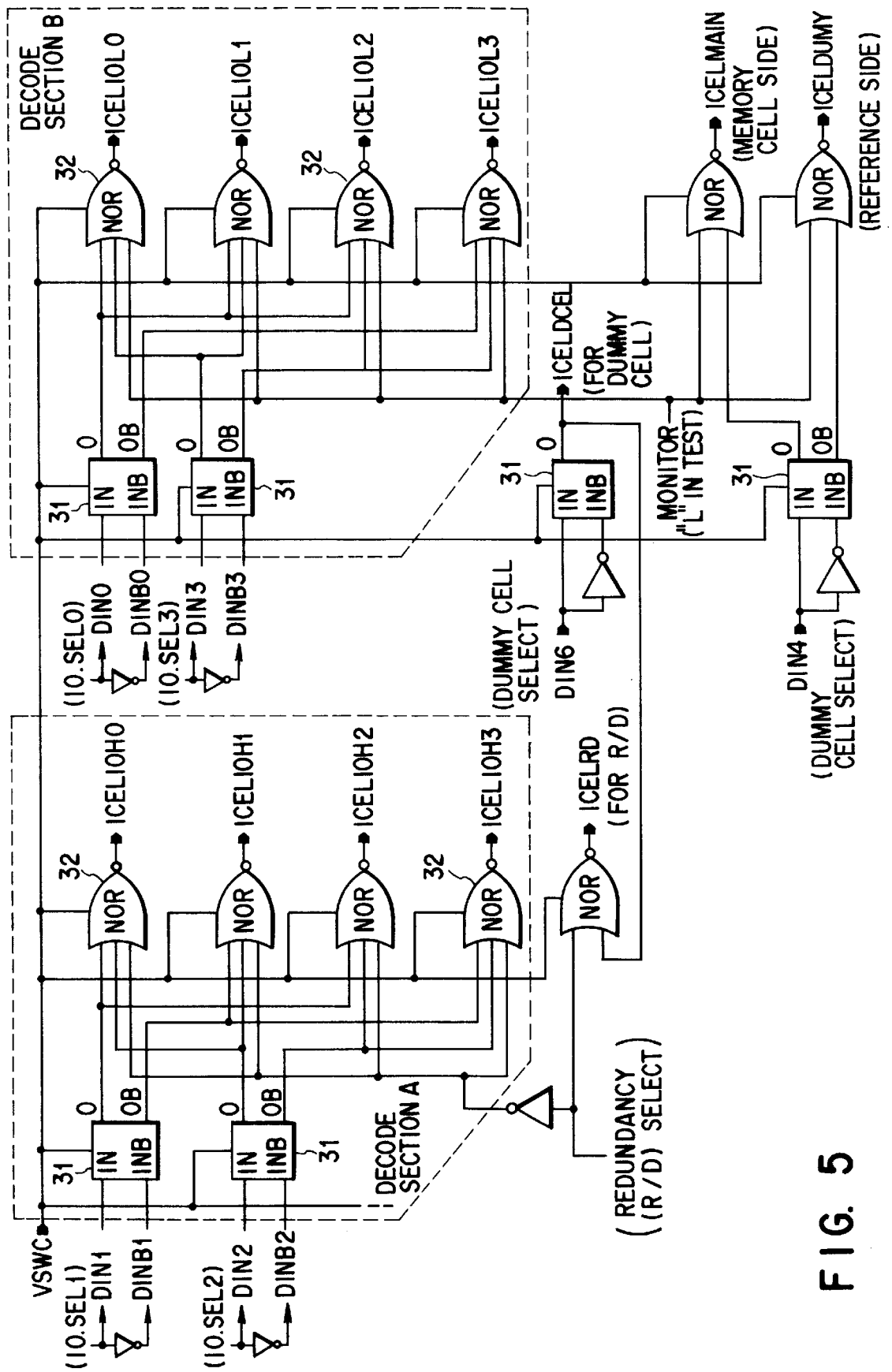
FIG. 5 is a circuit diagram of a concrete example of the monitor and I/O decoder circuit in FIG. 4.

FIG. 5 is a circuit diagram of a concrete example of the monitor and I/O decoder circuit 24 of FIG. 4.

In the test, signal IO_SEL is inputted from the selected pad to the inputs DIN0 to DIN3. In the figure, DINB0 to DINB3 are the complementary inputs of DIN0 to DIN3. Taking into account a potential drop caused by the transfer gate group (IOGATE) 26 connected to a subsequent stage, a level shifter 31 that converts the potential into a high potential VSWC. The signals passed through the level shifter 31 go through a plurality of NOR gates 32 and are decoded.

Decode section A selectively controls the first-stage transfer gates MT0 to MTi in the transfer gate group (IOGATE) 26 of FIG. 4 in accordance with the signals ICELIOH0 to ICELIOH3. Decode section B selectively controls the second-stage transfer gates MT20 to MT2n in the transfer gate group (IOGATE) 26 in accordance with the signals ICELIOL0 to ICELIOL3.

The signal MONITOR is changed by externally inputting a special command (e.g., a high-potential signal) via a specific pad. As in the other signal systems, the signal MONITOR has its complementary signal produced via the level shifter 31 and related circuits. During the test, the signal MONITOR of a low level is transmitted to decode section B.

The signal ICELRD of FIG. 5 is a signal used in accessing the memory cells that act in place of defective memory cells, or what we call a redundancy memory cell (R/D) group. The signal ICELDCEL is a dummy select signal that is inputted to a specific pad.

Figure 6:
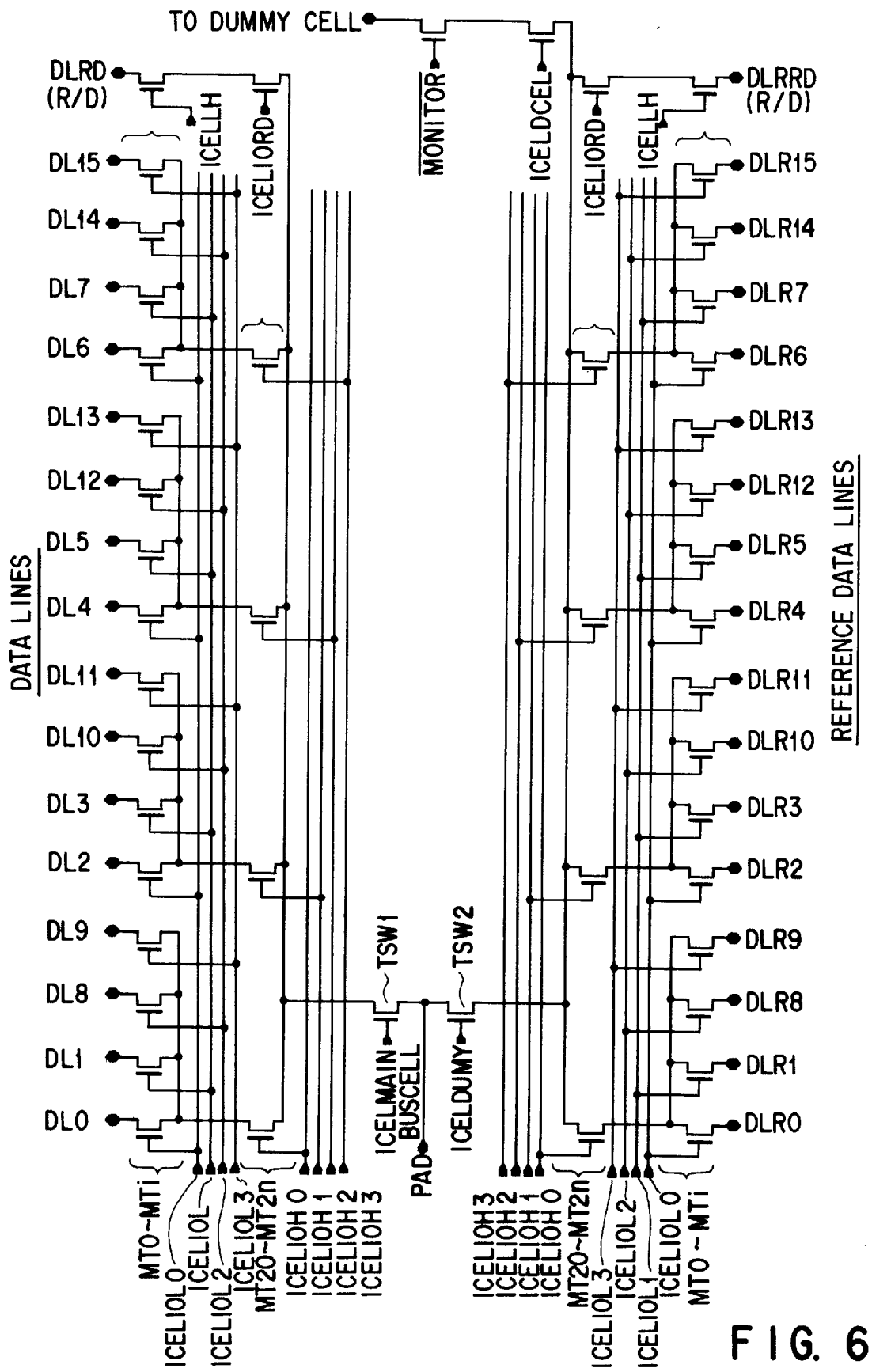
FIG. 6 is a circuit diagram of a concrete example of the transfer gate group in FIG. 4.

FIG. 6 is a circuit diagram of a concrete example of the transfer gate group (IOGATE) 26 of FIG. 4.

The transistors corresponding to the first-stage transfer gates MT0 to MTi are connected to the data lines DL0 to DL15 (DL0 to DLi in FIG. 4), respectively. DLRD indicates a data line connected to a redundancy memory cell group. The transistors corresponding to the second-stage transfer gates MT20 to MT2n are connected to the external pad 25 by way of the monitor bus line BUSCELL.

When one of the signals ICELIOH0 to ICELIOH3 is supplied from decode section A of FIG. 5, the supplied signal is applied to the corresponding gates of the transistor group (4 of the 16 transistors in FIG. 6) of the first-stage transfer gates MT0 to MTi of FIG. 6. When the transistor group to which the signal has been applied turns on, the corresponding data lines are selected.

When one of the signals ICELIOL0 to ICELIOL3 is supplied from decode section B of FIG. 5, the supplied signal is applied to the gate of the corresponding transistor (one of the four transistors in FIG. 6) of the second-stage transfer gates MT20 to MT2n of FIG. 6. When the transistor group to which the signal has been applied turns on, one of the selected data lines is selected. The current in the memory cell is directed to the external pad 25 via the selected data line.

With the configuration of FIG. 6, the reference current (the current in the dummy cell) in the reference data line DLR on the dummy cell side can be monitored. FIG. 4 has not shown this. The structure of the reference side is the same as that of the transfer gate group (IOGATE) 26 on the regular cell (main cell) side.

Such a configuration requires a switch circuit for switching between the main cell side and the reference side. To meet this requirement, transistors TSW1 and TSW2 are provided. Signal ICELMAIN and signal ICELDUMY generated in FIG. 5 are supplied to the gates of the transistors TSW1 and TSW2, respectively.

FIG. 7 is a table listing the destinations of the signals decoded by the decode sections A and B of FIG. 5 and the transfer gate group of FIG. 6. In FIG. 7, "H" indicates a high level and "L" indicates a low level.

In the table, the destination of a signal (any one of IO0 to IO15 corresponding to the data lines DL0 to DL15) is determined in accordance with the values of the inputs DIN0 to DIN3.

With the first embodiment, for example, the control of the decoder circuit is achieved using a combination of the inputs from the pads. The current in the memory cells are directed via the tree-structure transfer gate group to the outside of the device for monitoring. Because the decoder circuit is provided with the level shifter for converting the control signal into a high-potential signal, the potential drop caused by the transfer gate group can be compensated for. The first embodiment uses only one bus line and is designed to suppress an increase in the number of external pads. This feature is very helpful in producing highly integrated circuits. During the test, the row decoder applies a test voltage to the control gates of the memory cells. Because the test voltage is a variable voltage that can be changed externally, it is possible to examine the threshold voltage characteristic of the memory cell.

Figure 8:
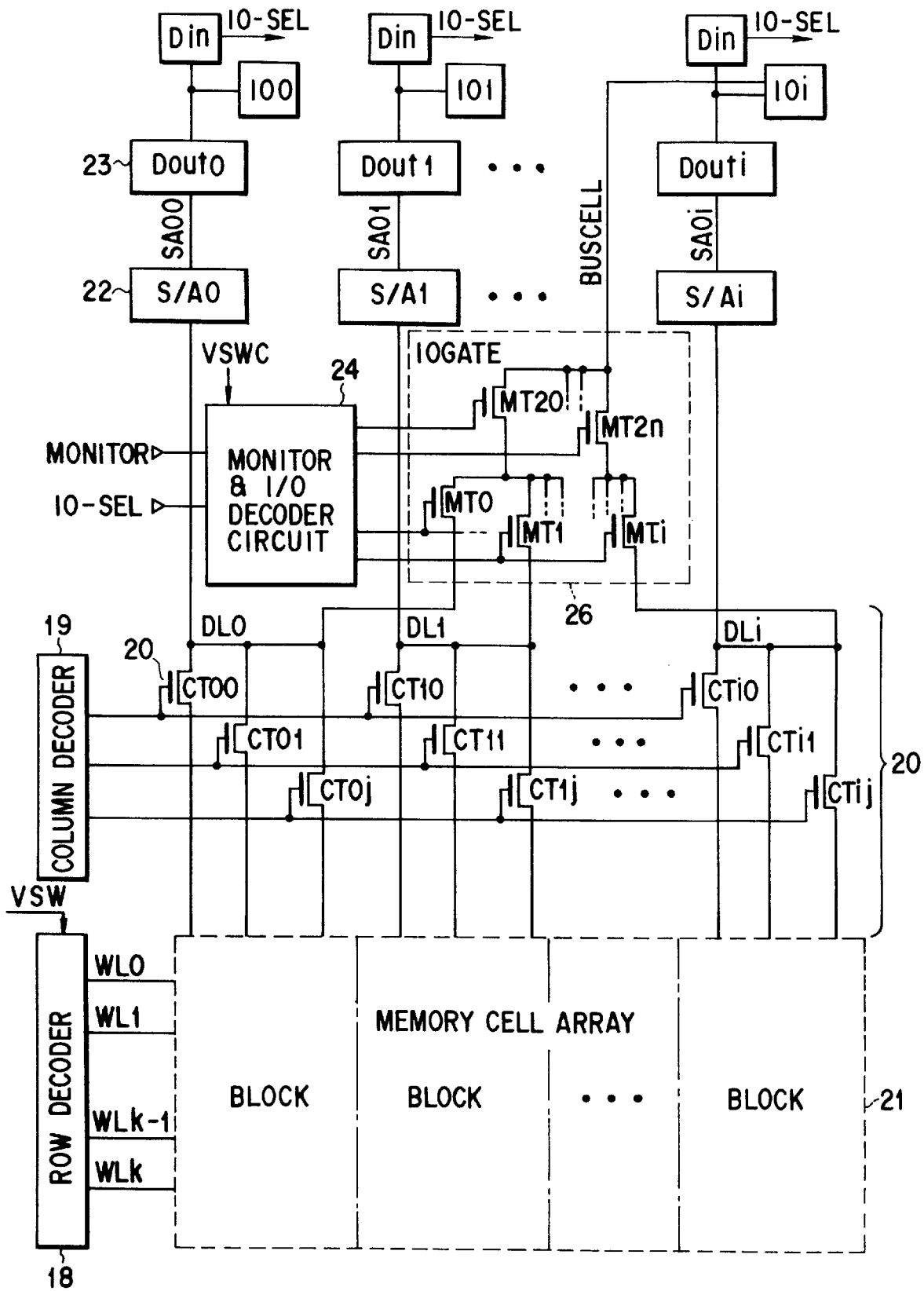
FIG. 8 is a circuit diagram of the main section of a semiconductor memory device according to a second embodiment of the present invention.

FIG. 8 is a circuit diagram of the main section of a semiconductor memory device according to a second embodiment of the present invention.

The second embodiment differs from the first embodiment of FIG. 4 in that one of a plurality of pads (IO1 to IOi) also serves as an external pad 25 to draw out a monitor bus line BUSCELL to the outside of the device. A circuit for changing the input/output route is built in, for example, pad IOi. A pad other than the pad for input/output may be used as the external pad 25. In this case, too, a circuit for changing the input/output route is needed.

The second embodiment produces the following effect, in addition to the effect of the first embodiment. With the configuration of the second embodiment, because the pad (any one of I01 to IOi) also serving as the monitor pad is provided relatively close to the transfer gate group (IOGATE) 26, the bus line BUSCELL can be made relatively short. In the first embodiment, because the monitor external pad 25 is provided relatively away from the transfer gate group (IOGATE) 26, the monitor bus line BUSCELL is relatively long. As a result, the area occupied by the bus line BUSCELL is made much smaller, enabling the monitor signal to be sensed with high accuracy.

As described in detail, with the present invention, use of the tree-structure transfer gate group and the decoder circuit for controlling the gates enables the current in each memory cell to be monitored at a single external terminal via a single bus line. This helps reduce the area occupied by the bus lines, thereby suppressing an increase in the chip size. Because the monitor bus line is provided independently, not shared by the output bus for the read circuit, which prevents the degradation of the performance.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the pad used in the above embodiments is illustrative of a connection terminal. Other types of connection terminal may be used as the pad.

We claim:

1. A semiconductor memory device comprising:
    a memory cell array in which a plurality of memory cells each to be accessed in accordance with selected row and column are arranged in a matrix;
    an external terminal used to monitor the current in each of said plurality of memory cells;
    a single bus line, connected to said external terminal, for conducting said current to said external terminal;
    a transfer gate group, provided between said bus line and said memory cell array and stacked so as to form a tree structure having multiple stages of transfer gates, for selectively connecting said bus line to any column in said memory cell array; and
    a decoder circuit for controlling to select the transfer gates for each of the multiple stages in said transfer gate group.

2. A semiconductor memory device according to claim 1, wherein said memory cells include regular memory cells to be accessed for data acquisition and a dummy cell for generating a reference potential to read the data from said regular memory cells, and redundancy memory cells replaceable with said regular memory cells.

3. A semiconductor memory device according to claim 2, further comprising a switch circuit, provided between said transfer gate group and said bus line, for electrically connecting either said regular memory cells' side or said dummy cell's side to said bus line via said transfer gate group.

4. A semiconductor memory device according to claim 1, wherein an output of said decoder circuit is obtained from a potential boosted inside the decoder circuit.

5. A semiconductor memory device according to claim 1, wherein during the monitoring of the current in each of said memory cells, a monitoring power-supply voltage is supplied to a row decoder for selecting said row.

6. A semiconductor memory device according to claim 5, wherein said monitoring power-supply voltage is variable.

7. A semiconductor memory device according to claim 6, wherein a threshold voltage for each of said memory cells is determined from the current monitored at said external terminal.

8. A semiconductor memory device according to claim 6, wherein said monitoring power-supply voltage is supplied from an external terminal different from said external terminal.

9. A semiconductor memory device according to claim 1, further comprising a plurality of terminals for transmitting signals corresponding to the columns in said memory cell array, wherein said decoder circuit controls to select said transfer gates in accordance with a combination of the signals supplied from said plurality of terminals.

10. A semiconductor memory device comprising:
    a memory cell array in which a plurality of memory cells each to be accessed in accordance with selected row and column are arranged in a matrix;
    an external terminal used to monitor the current in each of said plurality of memory cells;
    a single bus line, connected to said external terminal, for conducting said current to said external terminal;
    a transfer gate group, provided between said bus line and said memory cell array and stacked so as to form a tree structure having multiple stages of transfer gates, for selectively connecting said bus line to any column in said memory cell array;
    a decoder circuit for controlling to select the transfer gates for each of the multiple stages in said transfer gate group; and
    a plurality of terminals for transmitting signals corresponding to the columns in said memory cell array, wherein one of said plurality of terminals also serves as said external terminal.

11. A semiconductor memory device according to claim 10, wherein said external terminal is a terminal other than a terminal for intput/output.

12. A semiconductor memory device comprising:

a memory cell array that always allows the memory cells to be accessed in parallel;

decode means capable of selecting a signal corresponding to any one of the memory cells during said parallel accessing; and a single bus line for transmitting said signal selected by said decode means to the outside of the device.

13. A semiconductor memory device according to claim 12, wherein said decode means selects the signal in accordance with a combination of externally supplied signals.

14. A semiconductor memory device according to claim 12, wherein said decode means is activated when a test signal is externally supplied and applies to said memory cell array a signal potential different from that during the ordinary parallel access to the memory cells.

15. A semiconductor memory device according to claim 12, further comprising an external terminal connected to said bus line and used to monitor a current corresponding to the memory cell selected by said decode means.

16. A semiconductor memory device according to claim 15, wherein a threshold voltage for said memory cell is determined from the current monitored at said external terminal.

17. A semiconductor memory device according to claim 15, wherein said decode means includes:

a transfer gate group, provided between said bus line and said memory cell array and stacked so as to form a tree structure having multiple stages of transfer gates, and a decoder circuit for controlling to select the transfer gates for each of the multiple stages in said transfer gate group.

18. A semiconductor memory device according to claim 17, wherein said decoder circuit has a level shifter and controls to select the transfer gates using the high-potential signal outputted from said level shifter.

19. A semiconductor memory device according to claim 17, wherein a control gate of a memory cell selected by said decode means is applied with two or more kinds of voltages via said bus line.

* * * * *